United States Patent [19]

Tachikawa et al.

[11] 4,224,087
[45] Sep. 23, 1980

[54] METHOD FOR PRODUCING NB$_3$SN SUPERCONDUCTOR

[75] Inventors: Kyoji Tachikawa; Hisashi Sekine, both of Tokyo, Japan

[73] Assignee: National Research Institute for Metals, Tokyo, Japan

[21] Appl. No.: 16,273

[22] Filed: Feb. 28, 1979

[30] Foreign Application Priority Data

Sep. 14, 1978 [JP] Japan .................................. 53-112191

[51] Int. Cl.$^2$ ...................... H01L 39/00; C22C 27/02; C21D 9/52
[52] U.S. Cl. ...................................... 148/133; 29/599; 75/134 V; 148/11.5 Q
[58] Field of Search .................... 29/599; 148/127, 133, 148/11.5 R, 11.5 Q; 75/134 V

[56] References Cited

U.S. PATENT DOCUMENTS

| | | | |
|---|---|---|---|
| 3,778,894 | 12/1973 | Kono et al. | 148/127 |
| 3,792,990 | 2/1974 | Tachikawa et al. | 75/134 V |
| 3,857,173 | 12/1974 | Tachikawa et al. | 148/127 |
| 3,918,998 | 11/1975 | Maranick et al. | 148/127 |
| 3,930,903 | 1/1976 | Randall et al. | 29/599 |
| 4,094,060 | 6/1978 | Madsen et al. | 29/599 |
| 4,135,293 | 1/1979 | Madsen et al. | 148/133 |

FOREIGN PATENT DOCUMENTS

| | | | |
|---|---|---|---|
| 902802 | 6/1972 | Canada | 29/599 |
| 2505076 | 8/1976 | Fed. Rep. of Germany | 75/134 V |
| 1284531 | 8/1972 | United Kingdom | 29/599 |

OTHER PUBLICATIONS

*Journal of Applied Physics*, vol. 49, No. 1 (Jan. 1978), pp. 357–360.

*Primary Examiner*—L. Dewayne Rutledge
*Assistant Examiner*—Peter K. Skiff
*Attorney, Agent, or Firm*—Fitzpatrick, Cella, Harper & Scinto

[57] ABSTRACT

In a method for producing Nb$_3$Sn superconductors which comprises forming a composite consisting of a core portion and a sheath portion surrounding said core portion, said sheath portion being composed of a Cu-Sn alloy, and said core portion being composed of a Nb metal; elongating said composite; and heat-treating the resulting elongated composite to form an Nb$_3$Sn layer between said sheath and core portions; the improvement wherein the Cu-Sn alloy contains 1 to 20 atomic percent of Sn and the Nb metal is an Nb alloy containing 0.1 to 30 atomic percent of Hf.

5 Claims, 9 Drawing Figures

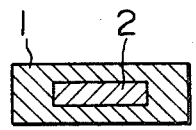
Fig. 1-a
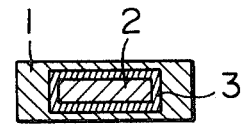
Fig. 1-b
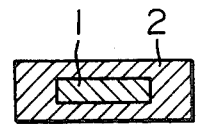
Fig. 2-a
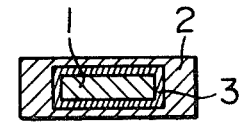
Fig. 2-b
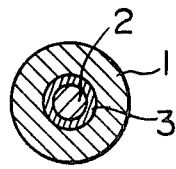
Fig. 3
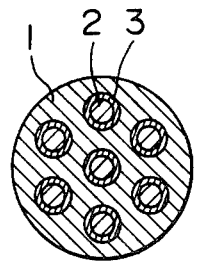
Fig. 4
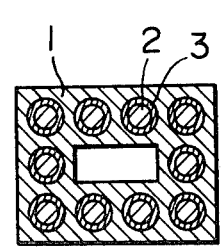
Fig. 5

METHOD FOR PRODUCING NB₃SN SUPERCONDUCTOR

This invention relates to a method for producing a superconductor, particularly an Nb₃Sn superconductor suitable for generating a strong magnetic field such as the one required in a nuclear fusion reactor.

Nb-Ti type alloy wires have been used heretofore as superconducting wires for the generation of a strong magnetic field. However, the magnetic field generated by these conventional wires is of 80,000 to 85,000 gauss [corresponding to 8 to 8.5 tesla (T for short)] at the highest, and compound superconductors must be used to generate a strong magnetic field of 12 T or more which is required, for example, in a nuclear fusion reactor.

Nb₃Sn compound is known as a superconducting material which meets this need, and a method for drawing it into wires is also known. For example, A. R. Kaufmann et al., in Bull. Am. Phys. Soc., 15, 838 (1970), suggested a method for producing wires of Nb₃Sn compound which comprises plastically fabricating a composite composed of a core of niobium (Nb) and a sheath of copper (Cu)-tin (Sn) alloy, and heat-treating the composite (the method which we call the "composite process").

In recent years, however, superconducting wires for large-sized magnets used in nuclear fusion, high energy physics, energy storage, etc. have been required to have a higher critical current within a strong magnetic field range of more than 15 T. The aforesaid conventional method cannot meet this requirement. To obtain a magnet capable of generating a high magnetic field, it is necessary to use superconducting wires having both a high upper critical magnetic field $H_{c2}$ and a high critical current density $J_c$ ($J_c$ is a value resulting from division of the critical current measured in a magnetic field by the cross-sectional area of the superconductor). The $J_c$ of Nb₃Sn wires produced by the aforesaid conventional method abruptly decreases in a magnetic field of 10 T or more, and it is difficult to produce superconducting magnets capable of generating a magnetic filed of 12 T or more from these wires.

Japanese Laid-Open Patent Publication No. 127,195/77 discloses a method for producing Nb₃Sn superconductor wires having a high critical current which comprises fabricating a composite composed of a Cu-Sn-Zn alloy and Nb or an Nb alloy containing a small amount of zirconium (Zr), hafnium (Hf) or titanium (Ti), and heat-treating the composite. According to this method, the critical current $I_c$ of the wires in a magnetic field of about 6.5 T is increased, but its $I_c$ in a strong magnetic field of 10 T or more is scarcely increased.

It is an object of this invention therefore to provide Nb₃Sn superconducting wires having both a high upper critical magnetic field ($H_{c2}$) and a high critical current density ($J_c$).

The above object of this invention is achieved by an improved method for producing Nb₃Sn superconductors which comprises forming a composite consisting of a core portion and a sheath portion surrounding said core portion, said sheath portion being composed of a Cu-Sn alloy, and said core portion being composed of a Nb metal; elongating said composite; and heat-treating the resulting elongated composite to form an Nb₃Sn layer between said sheath and core portions; wherein the Cu-Sn alloy contains 1 to 20 atomic percent of Sn, the Nb metal is a Nb alloy containing 0.1 to 30 atomic percent of Hf, and the Cu-Sn alloy optionally contains at least one additional metal selected from the group consisting of 0.1 to 15 atomic percent of gallium (Ga) and 0.1 to 10 atomic percent of aluminum (Al).

The proportions of alloy ingredients are expressed in atomic percent in the present specification and claims.

The method of this invention is an imporvement over the method of forming an Nb₃Sn layer by drawing a composite of an Nb metal and a Cu-Sn alloy into wires, and heat-treating the wires, and its novel aspect is that Hf is dissolved in Nb, and the resulting solid solution is combined with a Cu-Sn alloy. The dissolution of Hf in Nb markedly promotes the diffusion of Sn from the Cu-Sn alloy to the Nb alloy, and increases the formation rate of Nb₃Sn layer. Furthermore, the dissolution of Hf to Nb significantly increases $H_{c2}$ and $J_c$ in high magnetic fields of the Nb₃Sn layer.

In the method of this invention, Ga, or Al, or both (to be referred to as an assistant metal) may optionally be added to the Cu-Sn alloy which is one constituent metal of the composite. The assistant metal diffuses from the Cu-Sn alloy layer to the Nb-Hf alloy layer and comes into the Nb₃Sn layer formed by the diffusion reaction of Sn, thereby improving its superconducting characteristics. Hf dissolved in Nb promotes the diffusion of the assistant metal and its entry into the Nb₃Sn layer, and thus further increases the effect of improving the superconducting characteristics by the addition of the assistant metal.

It is stated at pages 357 to 360 of *Journal of Applied Physics*, Vol. 49, No. 1 (January 1978) that the addition of Ga or Al to a Cu-Sn alloy improves the characteristics of a fabricated Nb₃Sn composite. The present invention has successfully provided excellent superconducting characteristics by using a composite consisting of the aforesaid composite of the prior art and an Nb-Hf alloy. When the Nb-Hf alloy is used as a core, the diffusion of Ga or Al is promoted. Thus, Ga or Al more readily comes into the Nb₃Sn layer, and the effect of adding these assistant metals is very great.

In the process of this invention, an alloy composed of a solid solution of Hf in Nb (to be referred to as an Nb alloy) is produced by a melting technique. Separately, a Cu-Sn alloy or an alloy consisting of the Cu-Sn alloy and Ga or Al or both Ga and Al (to be referred to inclusively as a Cu-Sn alloy) is produced. The Nb alloy is used as a core and coated with the Cu-Sn alloy to obtain a composite of various shapes. The composite is then fabricated into a wire, tape or tube by wire drawing, rolling or tube drawing. The fabricated composite is then heat-treated to diffuse Sn or both Sn and a small amount of Ga and/or Al from the Cu-Sn alloy to the Nb alloy substrate to form an Nb₃Sn compound layer containing a small amount of Hf and as an optional ingredient, a small amount of Ga and/or Al. The greatest characteristic of this invention is that Hf is dissolved in Nb and if desired, Ga and/or Al is added to Cu-Sn alloy.

When the amount of Hf added to Nb is within the range of 0.1 to 30%, the aforesaid effect of forming the Nb₃Sn layer by diffusion is very much promoted, and the effect of adding Ga, Al or both as an assistant element to the Cu-Sn alloy is increased. The effect of Hf to promote the formation of the Nb₃Sn by diffusion is very advantageous in practice in that for example, the critical current density can be increased throughout the entire cross-sectional area of ultrafine multi-filamentary wires.

Hf has an additional effect of increasing $H_{c2}$ of $Nb_3Sn$ and incident to it, also increasing its $J_c$ in a strong magnetic field. To obtain excellent superconducting characteristics, the amount of Hf added is at least 0.1%, and to retain the good processability of the Nb alloy, the amount of Hf should be not more than 30%. The preferred amount of Hf is 3 to 10%, and the most preferred amount is 5 to 7%. The amount of Sn to be included in Cu is 1 to 20%, preferably 3 to 10%. When the Sn content exceeds 20%, the processability of the Cu-Sn alloy is impaired, and troubles such as fracture occur in the fabricating step. When the Sn content is less than 1%, it is difficult to form the $Nb_3Sn$ compound layer by heat-treatment. When Ga, Al or both are to be added to the Cu-Sn alloy, the amount of Ga is 0.1 to 15%, preferably 3 to 10%, the amount of Al is 0.1 to 10%, preferably 1 to 5%, and the total amount of these should not exceed 20%, preferably 12%, in order to improve the characteristics of the resulting $Nb_3Sn$ layer, and retain the good fabricability of the Cu-Sn alloy.

The composite composed of the Cu-Sn alloy and the Nb alloy can be produced, for example, by the following procedure.

A matrix of the Cu-Sn alloy, i.e. a Cu alloy containing a predetermined amount of Sn and optionally Ga and/or Al, and a rod of the Nb alloy, i.e. the Nb-Hf alloy having a specified composition are prepared. A hole of a size sufficient for the insertion of the Nb-Hf alloy rod is formed in the Cu-Sn alloy matrix. The Nb-Hf alloy rod is inserted into the hole to obtain a preformed composite. The preformed composite is hot or cold rolled to elongate it to the desired shape and size. The composite can also be produced by compression-molding the Cu-Sn alloy and the Nb-Hf alloy in powder form to give a preformed compsite, and then rolling it.

Instead of rolling, the preformed composite may be plastically fabricated into the desired shape and size by an elongating method such as tube drawing, extrusion or wire drawing.

The fabricated composite is then heat-treated to form $Nb_3Sn$ layer at the interface between the Cu-Sn alloy and the Nb alloy.

The heat-treatment temperature is generally 500° to 900° C., preferably 650° to 850° C., more preferably 700° to 800° C., and the heat-treatment time is from 10 minutes to 200 hours, preferably 1 hour to 150 hours, more preferably 10 hours to 100 hours.

The quantitative ratio between the core portion and the sheath portion is not critical in particular, but usually, in the cross-section of the elongated material, the cross-sectional area of the core portion accounts for 10 to 50% of the total cross-sectional area of the elongated material.

As a result of the heat-treatment, Sn diffuses selectively from the Cu-Sn alloy to Nb to form a continuous $Nb_3Sn$ layer containing a small amount of Hf or additionally a small amount of Ga, Al or both within the superconductor. For practical application, the superconductor is desirably stabilized by covering the outside of the conductor with pure Cu or pure Al or by combining such a pure metal within the conductor.

The $Nb_3$-Sn superconductors produced by the method of this invention have a high upper critical magnetic field $H_{c2}$ and a markedly increased critical current density $J_c$ in a strong magnetic field. These superconductors are fully feasible in practical applications because they have a $J_c$ in a strong magnetic field of at least about $5\times 10^4$ A/cm$^2$ of the cross-section of the $Nb_3Sn$ layer. Superconducting magnets capable of generating a magnetic field of 15 T or higher can be produced from the $Nb_3Sn$ superconducting wires of this invention. Since the $Nb_3Sn$ superconductors produced by the method of this invention not only have superior $J_c$ characteristics in a strong magnetic field, but also can be drawn into ultrafine multifilamentary wires, they are advantageous in regard to stability to flux jump or to variations of the magnetic field with time. Since the $Nb_3Sn$ superconductors obtained by this invention have good processability with regard to the plastic fabrication of the composite, wires can be produced from them by using conventional techniques.

The invention is described below further with reference to the accompanying drawings in which:

FIG. 1-a is a sectional view showing one embodiment of a rolled tape-like composite in accordance with this invention;

FIG. 1-b is a sectional view showing a superconductor obtained by heat-treating the composite shown in FIG. 1-a;

FIG. 2-a shows a modified embodiment of a rolled composite having the sheath alloy of FIG. 1-a as a core and the core alloy of FIG. 1-a as a sheath;

FIG. 2-b is a sectional view showing a superconductor obtained by heat-treating the composite shown in FIG. 2-a;

FIG. 3 is a sectional view showing one embodiment of a composite single-core wire of the superconductor of this invention;

FIG. 4 is a sectional view showing one embodiment of a composite multi-core wire of the superconductor of this invention;

FIG. 5 is a sectional view showing one example of a multi-core hollow superconductor in accordance with this invention.

Figure 6:
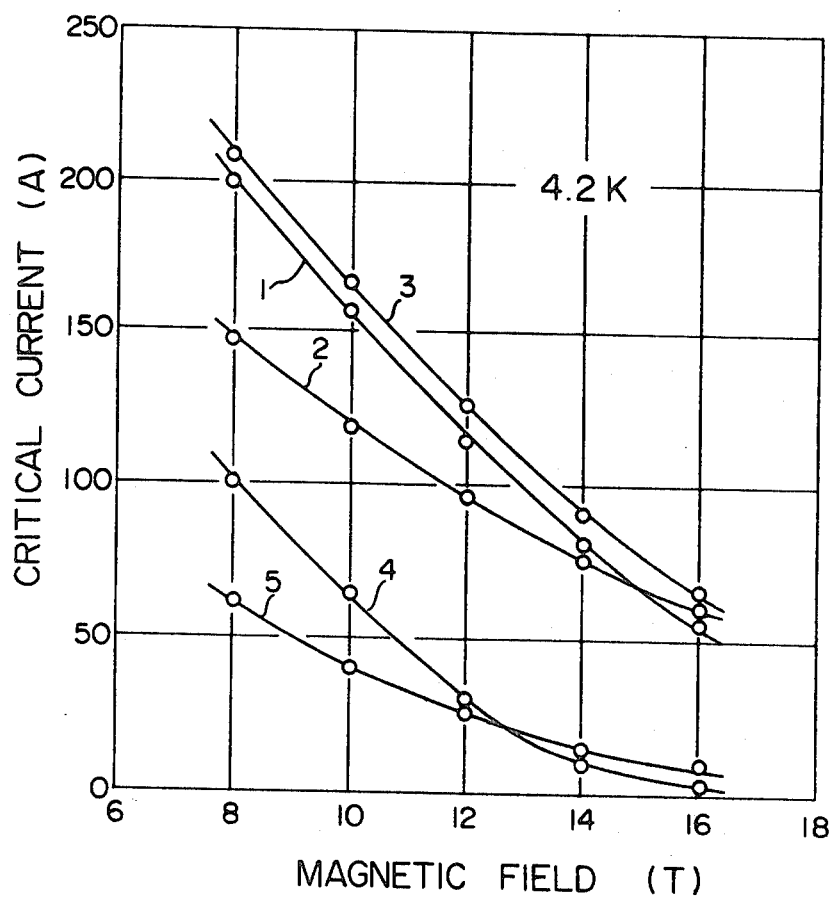
FIGS. 6 and 7 diagrams showing variations in the critical current of the $Nb_3Sn$ superconducting wire of this invention versus applied magnetic fields in comparison with those of conventional superconducting wires.

In FIG. 1-a, the reference numeral 1 represents a sheath portion composed of Cu-Sn alloy, and the reference numeral 2, a core portion composed of Nb alloy.

When the tape-like composite, as shown in FIG. 1-a, is heat-treated, a layer 3 of $Nb_3Sn$ is formed at the interface between the Nb alloy 2 and the Cu-Sn alloy 1.

A superconductor of the type shown in FIG. 2-b in which a layer 3 of $Nb_3Sn$ is formed at the interface between the core and the sheath can also be formed by making a composite of the type shown in FIG. 2-a in the same way as above except that the Nb-Hf alloy is used as the sheath and the Cu alloy, as the core.

A wire-like single-core superconductor of the type shown in FIG. 3 can be produced by a similar method to that described hereinabove.

A multifilamentary wire superconductor of the type shown in FIG. 4 can be produced by using a composite in which a plurality of cores are embedded in a sheath alloy. Furthermore, a multi-core hollow superconductor of the type shown in FIG. 5 which is made hollow to further increase the effect of cooling by liquid helium can be produced by embedding a plurality of cores in a hollow sheath.

In any of these modified embodiments, the layer 3 of $Nb_3Sn$ is formed at the interface between the core portion and the sheath portion.

The following Examples illustrate the present invention in greater detail.

EXAMPLE 1

A material composed of pure Nb and a material consisting of Nb and 5% of Hf were each melted in an arc melting furnace in an atmosphere or argon, and fabricated to a diameter of 3.5 mm with grooved rolls and by swaging to form a pure Nb rod and an Nb-Hf alloy rod. Separately, 7% of Sn was blended with Cu, and the blend was melted in a Tanmann melting furnace in the open atmosphere. The melt was cast into a mold to form an alloy rod having a diameter of 15 mm and a length of 100 mm, shaped to a diameter of 9 mm with grooved rolls and by swaging. Then, a hole of 3.5 mm in diameter was drilled in the alloy rod to form an alloy tube. In the same way as above, an alloy tube of the same size consisting of Cu, 5% of Sn and 4% of Ga and an alloy tube of the same size consisting of Cu, 6% of Sn and 2% of Al were produced.

The pure Nb rod or the Nb-Hf alloy rod was inserted in the Cu-Sn alloy tube, Cu-Sn-Ga tube and Cu-Sn-Al alloy tube to form composites. Each of the composites was rolled at room temperature first with grooved rolls to a 2.5 mm square shape, and then with flat rolls. In the intermediate stage of the rolling, the rolled product was subjected to intermediate annealing in vacuum at 650° C. for about 30 minutes. Finally, it was shaped to a tape having a thickness of 0.25 mm and a width of 5 mm (the Nb alloy core had a thickness of about 0.1 mm and a width of about 1.9 mm). The cross-sectional shape of the tape is shown in FIG. 1-a.

Samples, 30 mm long, were cut out from the tapes so as to measure their superconducting characteristics. The samples were heat-treated at 800° C. for 20 hours. The cross-sectional structure of the heat-treated tape is shown in FIG. 1-b. In FIG. 1-b, the reference numeral 1 represents Cu-Sn alloy; 2, Nb-Hf alloy; and 3, the resulting $Nb_3Sn$ compound layer containing a small amount of Hf or additionally a small amount of Ga or Al.

Table 1 summarizes the combinations of a sheath of Cu-Sn, Cu-Sn-Ga or Cu-Sn-Al alloy with a core of Nb or Nb-Hf alloy, the thicknesses of the $Nb_3Sn$ layers formed by diffusion, the transition temperatures ($T_c$), and the critical current densities ($J_c$) at a magnetic field strength of 15 T calculated from the critical current measured in a magnetic field of 15 T at 4.2° K. and the cross-sectional area of the $Nb_3Sn$ layer, which data were obtained with the aforesaid samples. FIG. 6 shows the results of measurement at 4.2° K. of magnetic field-critical current curves ($H$-$J_c$ curves) which represent the relation of the critical current versus the strength of a magnetic field applied. Curves 1 to 5 in FIG. 6 correspond to samples Nos. 1 to 5 of Example 1 shown in Table 1.

It is seen from Table 1 and FIG. 6 that the composite tape composed of Nb-Hf alloy and Cu-Sn alloy (curve 1) has an $Nb_3Sn$ layer having a much increased $J_c$ in high magnetic fields and a thickness about 2 times as large as that in the composite tape consisting of pure Nb and Cu-Sn alloy (curve 4). The composite tape consisting of Cu-Sn alloy containing an assistant element (curve 5), and also has an increased $H_{c2}$, and therefore, the decreases of critical current and critical current density with increasing magnetic field are relatively small. In the composites composed of Nb-Hf alloy and Cu-Sn-Ga or Cu-Sn-Al alloy (curves 2 and 3), increases of $H_{c2}$ and critical current in a strong magnetic field are further enhanced. A comparison of curve 5 with curve 2 shows that the addition of Hf to Nb exceedingly strengthens the effect of adding Ga. The transition temperature $T_c$ somewhat increased by the addition of Hf to Nb or by the addition of Hf to Nb and the addition of Ga or Al to the Cu-Sn alloy.

Table 1

| Ex. | Sample No. | Amount of Hf added to Nb (%) | Amount of elements in the Cu-base alloy (%) | | | Thickness of the $Nb_3Sn$ layer (μm) | Critical current density at 4.2° K. and 15 T ($\times 10^4$ A/cm$^2$) | Transition temperature (K.°) |
| --- | --- | --- | --- | --- | --- | --- | --- | --- |
| | | | Sn | Ga | Al | | | |
| 1 | 1 | 5 | 7 | — | — | 24 | 7.3 | 17.6 |
| | 2 | 5 | 5 | 4 | — | 17 | 10.2 | 17.6 |
| | 3 | 5 | 6 | — | 2 | 27 | 7.6 | 17.5 |
| | 4 | — | 7 | — | — | 12 | 1.1 | 17.3 |
| | 5 | — | 5 | 4 | — | 8 | 3.6 | 17.5 |
| 2 | 6 | 3 | 7 | — | — | 19 | 5.5 | 17.5 |
| | 7 | 3 | 5 | 4 | — | 13 | 8.5 | 17.5 |
| | 8 | 7 | 7 | — | — | 28 | 7.4 | 17.6 |
| | 9 | 7 | 6 | — | 2 | 30 | 7.9 | 17.6 |
| 3 | 10 | 5 | 3 | 9 | 1 | 10 | 12.5 | 17.7 |
| | 11 | 5 | 5 | 4 | 3 | 18 | 10.8 | 17.6 |

EXAMPLE 2

By the same melting and fabricating methods as set forth in Example 1, Nb-base alloy rods having a diameter of 3.5 mm containing 3% and 7% of Hf dissolved in Nb, and Cu-Sn alloy tubes having an outside diameter of 9 mm and an inside diameter of 3.5 mm composed of Cu, 5% of Sn and 4% of Ga, and Cu, 6% of Sn and 2% of Al were produced.

Each of the Nb alloy rod was inserted into each of the Cu-Sn alloy tubes to form a composite. The composite was plastically fabricated by the same method as in Example 1, and a tape sample having a thickness of 0.25 mm and a width of 5 mm (the core Nb alloy had a thickness of about 0.1 mm and a width of about 1.9 mm) was finally obtained. Short samples, 30 mm long, were cut out from the tape, enclosed in a quartz tube in an argon gas, and heat-treated at 800° C. for 20 hours.

Figure 7:
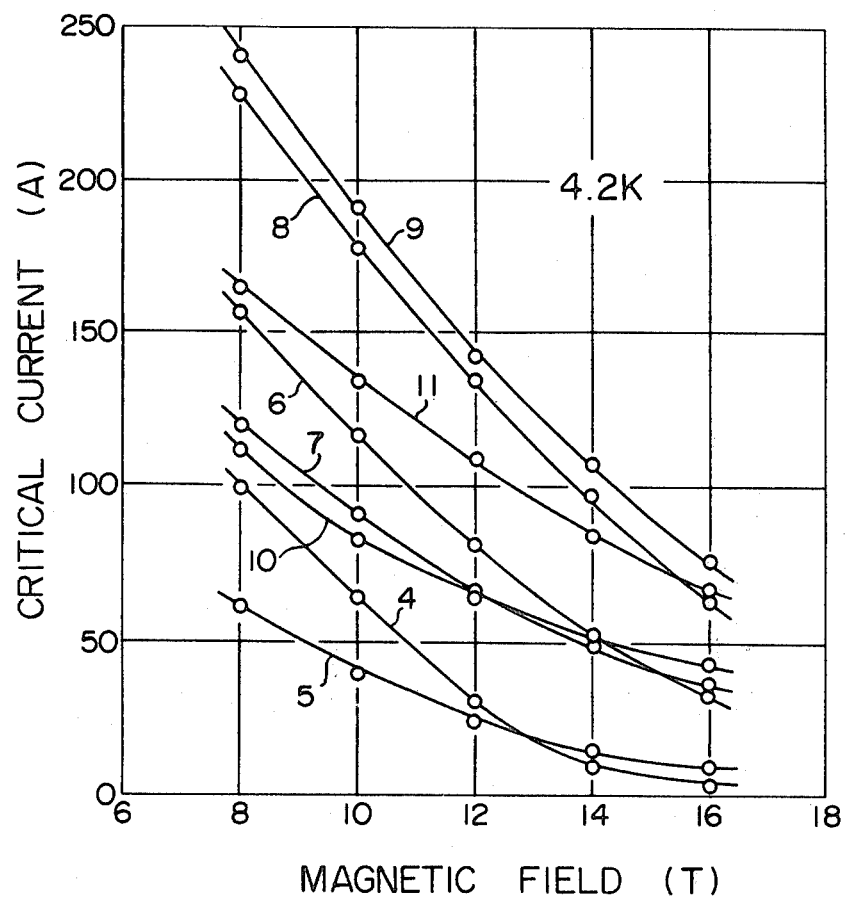

Table 1 summarizes the thickness of the $Nb_3Sn$ layer, $T_c$, and $J_c$ at a magnetic field of 15 T of the heat-treated samples (samples Nos. 6 to 9). The curves 6 to 9 in FIG. 7 correspond respectively to samples Nos. 6 to 9 in Table 1.

EXAMPLE 3

Composites having the same size as in Example 1 were produced in which an Nb alloy having 5% of Hf dissolved in Nb was covered with each of a Cu-Sn alloy consisting of Cu, 3% of Sn, 9% of Ga and 1% of Al, and a Cu-Sn alloy consisting of Cu, 5% of Sn, 4% of Ga and 3% of Al. $Nb_3Sn$ tapes (samples Nos. 10 to 11) were obtained by the same plastic fabrication and heat-treatment as in Example 1. Table 1 summarizes the thicknesses of the $Nb_3Sn$ layers, the critical current densities $J_c$ and the transition temperatures $T_c$ of the heat-treated samples. The magnetic field-critical current curves of these samples are shown in curves 10 and 11 of FIG. 7. It is seen from the results that the addition of both Ga and Al to Cu-Sn alloy to be combined with the Nb-Hf alloy is also effective.

What we claim is:

1. In a method for producing $Nb_3Sn$ superconductors which comprises forming a composite consisting of a core portion and a sheath portion surrounding said core portion, said sheath portion being composed of a Cu-Sn alloy, and said core portion being composed of a Nb metal; elongating said composite; and heat-treating the resulting elongated composite to form an Nb$_3$Sn layer between said sheath and core portions; the improvement wherein the Cu-Sn alloy contains 1 to 20 atomic percent of Sn and the Nb metal is an Nb alloy containing 0.1 to 30 atomic percent of Hf.

2. The method of claim 1 wherein the Cu-Sn alloy further contains at least one metal selected from the group consisting of 0.1 to 15 atomic percent of Ga and 0.1 to 10 atomic percent of Al.

3. The method of claim 1 wherein the heat-treatment is carried out at a temperature of from 600° C. to 900° C.

4. The method of claim 1 wherein the heat-treatment is carried out for a period of time of from 1 minute to 200 hours.

5. The method of claim 1, 2, 3 or 4 wherein the Nb forms the sheath portion and the Cu-Sn alloy forms the core portion.

* * * * *